Figure 1:
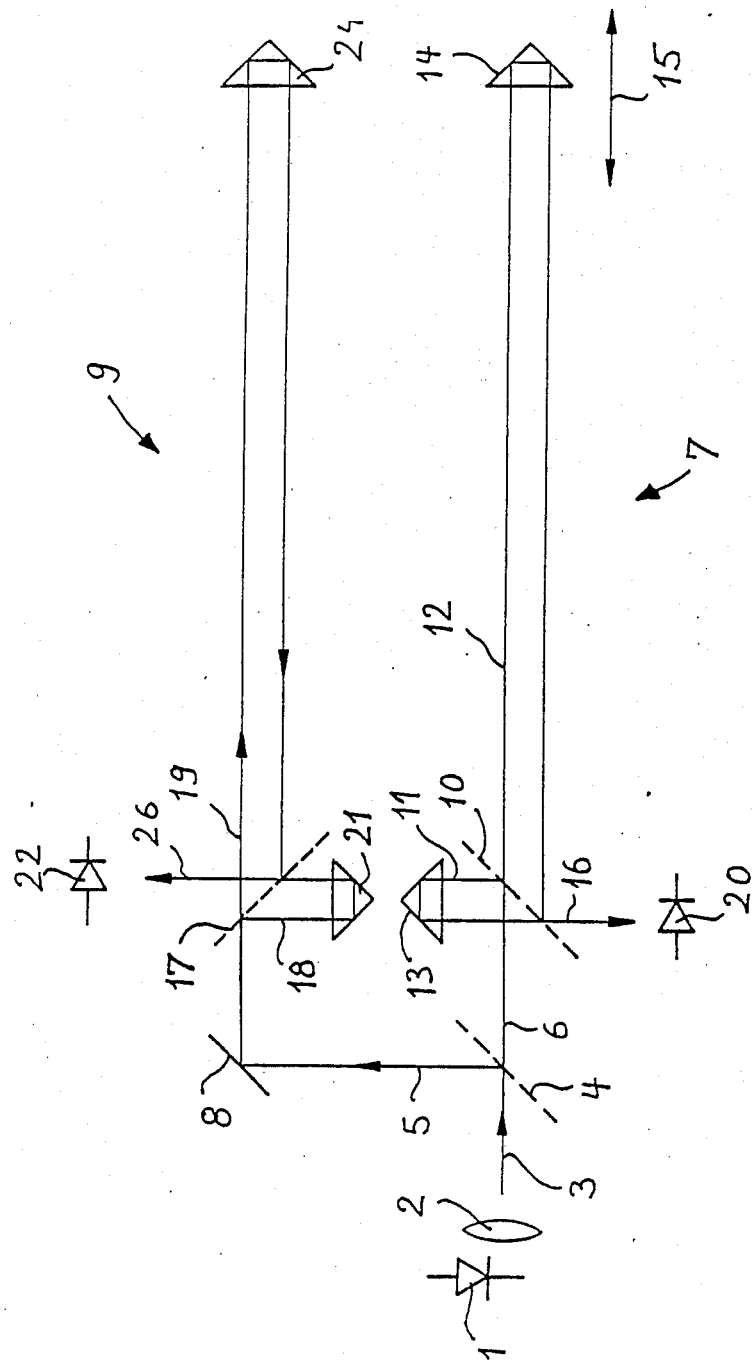

United States Patent [19]

Höfler et al.

[11] Patent Number: 4,984,898
[45] Date of Patent: Jan. 15, 1991

[54] LASER INTERFEROMETER FOR INTERFEROMETRIC LENGTH MEASUREMENTS INCLUDING AN AUTOMATIC-COMPENSATING CIRCUIT

[75] Inventors: Heinrich Höfler, Teningen; Eckhard Bergmann, Freiburg, both of Fed. Rep. of Germany

[73] Assignee: Fraunhofer-Gesellschaft Zur Forderung Der Angewandten Forschung E.V., Munich, Fed. Rep. of Germany

[21] Appl. No.: 274,810
[22] PCT Filed: Feb. 12, 1988
[86] PCT No.: PCT/DE88/00069
  § 371 Date: Sep. 29, 1988
  § 102(e) Date: Sep. 29, 1988
[87] PCT Pub. No.: WO88/06711
  PCT Pub. Date: Sep. 7, 1988

[30] Foreign Application Priority Data

Feb. 27, 1987 [DE] Fed. Rep. of Germany ....... 3706347

[51] Int. Cl.⁵ .............................................. G01B 9/02
[52] U.S. Cl. ................................................. 356/358
[58] Field of Search ........................ 356/356, 357, 358

[56] References Cited

U.S. PATENT DOCUMENTS 3,588,254  6/1971  Rhoades ............................. 356/358
4,583,228  4/1986  Brown .................................. 372/32
4,729,653  3/1988  Kobayashi .......................... 356/358

FOREIGN PATENT DOCUMENTS 1154656  9/1963  Fed. Rep. of Germany .
3425476  1/1985  Fed. Rep. of Germany .
3404963  8/1985  Fed. Rep. of Germany .
3421213  12/1985  Fed. Rep. of Germany .
3528259  2/1987  Fed. Rep. of Germany .
116556   1/1984  Japan .
2154787  9/1985  United Kingdom .

OTHER PUBLICATIONS

Wellenlangenstabilisation, 449 Feinwerktechnik & Messtechnik, vol. 87, (1979) Nov./Dec. No. 8.
"Laser Interferometer for high Temperature isothermal length changes over long time periods", 8127 Review of Scientific Instruments, vol. 52 (19810, Dec., No. 12, New York, U.S.A.

Primary Examiner—Samuel Turner
Attorney, Agent, or Firm—Jeffers, Hoffman & Niewyk

[57] ABSTRACT

In a laser interferometer for interferometric linear measurement, a semiconductor laser (1) energizes a measuring interferometer (7) with which there is coordinated a spatially directly adjacent reference interferometer (9). The output signal of the reference signal detector (22) of the reference interferometer (9) is used to effet in the event of changes in the refraction index of the medium occupying the reference section and the measuring section a frequency tuning of the semiconductor laser (1) in such a way that the wavelength acting as a length normal will be kept constant in the reference interferometer (9) and the measuring interferometer (7).

6 Claims, 2 Drawing Sheets

LASER INTERFEROMETER FOR INTERFEROMETRIC LENGTH MEASUREMENTS INCLUDING AN AUTOMATIC-COMPENSATING CIRCUIT

The invention concerns a laser interferometer for interferometric linear measurement with a semiconductor laser whose light, by way of a beam splitter, energizes a measuring interferometer with two reflectors, of which one is connected with the movable object to be covered, and a reference interferometer with a fixed reflector arrangement, which reference interferometer serves to control the laser light wavelength, is spatially adjacent to the measuring interferometer and whose interference ligh beam energizes a reference signal detector which is connected to a control circuit which readjusts the frequency of the semiconductor laser and keeps the output signal of the reference signal detector constant, while the interference light beam of the measuring interferometer containing the information regarding the length to be determined falls on an interference signal detector whose output signal energizes an evaluating device for determining the distance changes of the movable object.

Laser interferometers are used in the linear metrology to determine geometric quantities, such as lengths, distances, speeds etc. They are used especially in machine tools and coordinate measuring equipment. To obtain high measuring accuracies it is necessary to allow for the influence of the refraction index of the ambient air on the laser beam that is used as a wavelength normal. Such a refraction index caused by changes of the air temperature, air pressure and relative humidity is frequently allowed for by the so-called parameter method, where individual measurements of the air temperature, air pressure and relative humidity are used to determine the refraction index in order to correct the linear measurement with the aid of the result thus obtained. This leads not only to time delays until the correct measuring result is available, but also to problems when the effects of the refraction index are subject to quick changes, since allowing for them is then not possible.

A laser interferometer for linear measurement with a measuring interferometer and a reference interferometer serving to regulate the laser light wavelength are known from the German patent document No. 34 04 963 A1. The reference interferometer serves the stabilization of the frequency or wavelength of the semiconductor laser used and is fixed, along with the optical components of the measuring interferometer, on a base so as to obtain a compact structure that requires little space. The arm of the reference interferometer serving the stabilization of the laser light wavelength extends parallel with the base, which for compactness is small, and transverse to the direction of propagation of the light in the measuring arm of the measuring interferometer. Since the light in the reference interferometer traverses on its way to the reference section reflector, which is offset sideways relative to the measuring arm, a short air space there occurs in the laser light wavelength stabilization a compensation according to the refraction index effected by the temperature, pressure and relative humidity of the air above the base.

The problem underlying the invention is to provide a laser interferometer of the initially cited type which is distinguished by a high measuring accuracy also when the measuring arm of the laser interferometer is disturbed by local turbulences and inhomogeneities within the measuring section.

This problem is inventionally solved in that the reference section of the reference interferometer extends at a lateral distance, small in relation to the length of the reference section, across a distance which approximates the length of the measuring section, parallel with the measuring section of the measuring interferometer, and is delimited on the end of the reference section away from the semiconductor laser by a reference section reflector whose position, fixed during the measurement, is adjustable in the longitudinal direction of the measuring and reference sections.

With the aid of the reference interferometer extending along the measuring interferometer and of the control circuit connected with it, the supply current and the operating temperature of the semiconductor laser is upon changes of the refraction index of the air in the measuring arm of the laser interferometer so changed that the ratio of vacuum length to refraction index to the air, i.e., the wavelength of the air, remains constant. As a result, the wavelength normal for the air volume actually traversed by the measuring beam has a constant length, since both the reference interferometer and the measuring interferometer are influenced essentially by the same air volume.

Suitable advancements and developments of the invention are characterized in the subclaims.

The invention will be more fully explained hereafter with the aid of an embodiment illustrated in the drawing.

Figure 2:
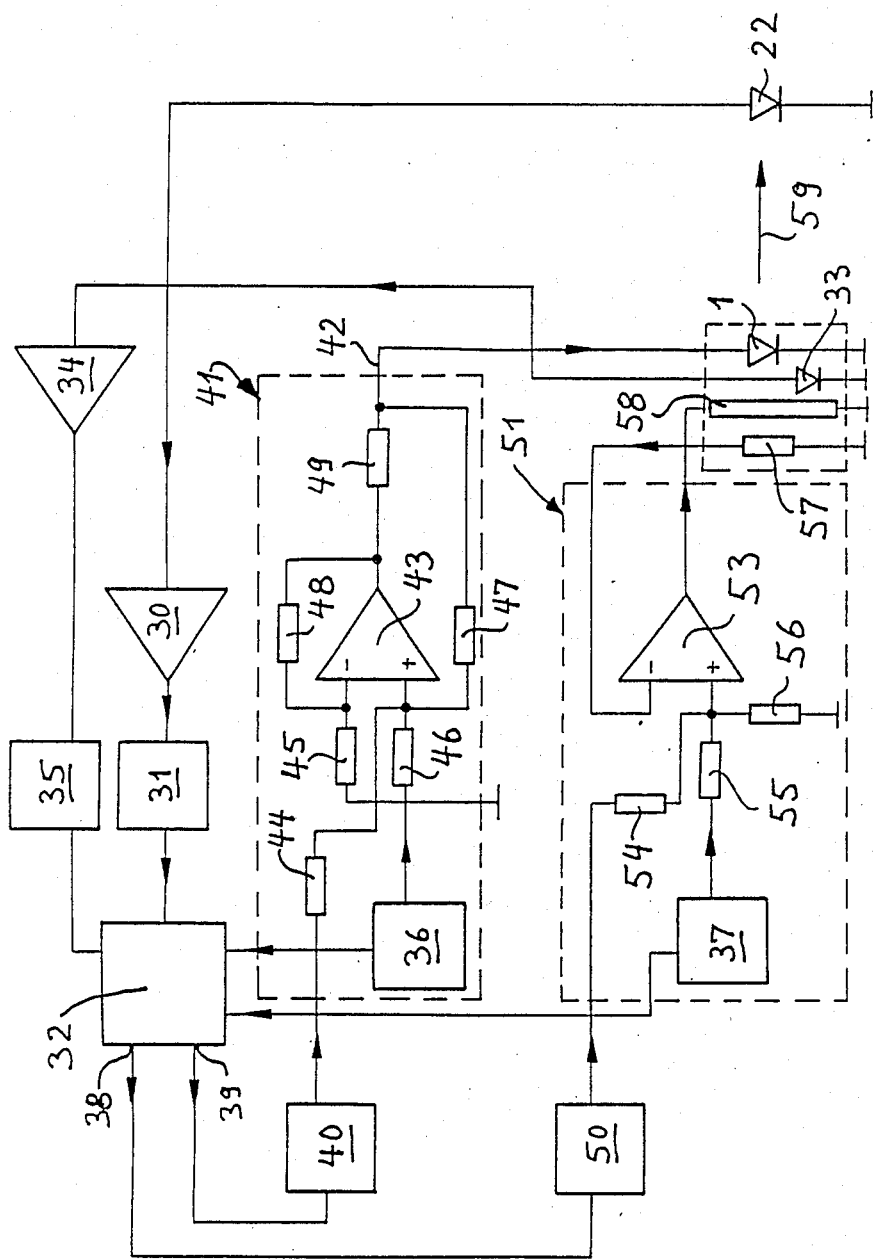

FIG. 1 shows a schematic illustration of the measuring interferometer and the reference interferometer coupled with it according to the invention;

FIG. 2 a circuit for controlling the semiconductor laser in contingence on the output signal of the reference interferometer.

The laser interferometer illustrated in FIG. 1 for interferometric measurement of geometric quantities features a semiconductor laser 1 for interferometric measurement of geometric dimensions, which is illustrated schematically in FIG. 1 with the lens 2 coordinated with it. The laser light beam 3 leaving the lens 2 is divided in a reference light beam 5 and a measuring light beam 6 with the aid of a beam splitter 4. The measuring light beam 6 serves the operation of a measuring interferometer 7 which is schematically illustrated in FIG. 1 and designed as a Michelson interferometer. The reference light beam 5 energizes by way of a reversing mirror 8 a second Michelson interferometer serving as a reference interferometer 9. The measuring light beam 6 energizing the measuring interferometer 7 is divided, with the aid of a measuring section beam divider 10, in a first light beam 11 and a second light beam 12. The first light beam 11 proceeds to a measuring reflector 13, which is a triple reflector and reverses the first light beam 11 to a measuring signal detector 20.

The second light beam 12 propagates along the measuring section and proceeds finally to a measuring section reflector 14 which is movable in the direction of propagation of the light beam 12, is a triple reflector as well and follows, e.g., the motion or contour of an object to be measured. The length of the measuring section may be in the order, e.g., of one meter. The motion of the mobile section reflector 14, in the direction of the double arrow 15, may as well be in the order of, e.g., one meter.

The second light beam 12 reflected by the measuring section reflector 14 at a lateral offset traverses the measuring section again and arrives finally on the back of the measuring section beam divider 10 by which it is reversed toward the measuring signal detector 20, with the second light beam 12 forming together with the first light beam 11 an interference light beam 16. Upon relocation of the mobile measuring section reflector 14, corresponding to the motion of the object to be monitored or the pattern of the contour to be covered, the section to be traversed by the second light beam 12 changes, and with it the cycle phase of the measuring interferometer 7, so that on the measuring signal detector 20 there occurs a sequence of signal maximums and signal minimums in contingence on the wavelength of the light, the refraction index of the medium in the measuring section and in the relocation of the measuring reflector 14.

Due to the contingency of the interference signal on the measuring signal detector 20 upon the refraction index of the medium traversed by the second light beam 12, measuring errors can occur if the change of the wavelength acting as a wavelength normal resulting from a change of the refraction index is not compensated for.

In the interferometer illustrated schematically in FIG. 1, a compensation of the refraction index influence is accomplished with the aid of the previously mentioned reference interferometer 9, by which refraction index changes are determined in order to so readjust the frequency or vacuum wavelength of the semiconductor laser 1 in accordance with the changes that the air wavelength used in the measuring interferometer 7, of the second light beam 12, remains constant.

Following the reversal with the aid of the reversing mirror 8, the reference light beam 5 proceeds to the reference interferometer 9 which, similar to the measuring interferometer 7, features a reference section beam divider 17. The first reference light beam 18 deflected by the reference section beam divider 17 is reversed with the aid of a reference reflector 21 and proceeds, after traversing the reference section beam divider 17, to a reference signal detector 22 which, the same as the semiconductor laser 1, is connected with the circuitry arrangement illustrated in FIG. 2, whereas the circuit arrangement coordinated with the measuring signal detector 20, for evaluation of the measuring section, is not illustrated in the drawing.

On the side opposite the mirror 8, of the reference beam divider 17, a second reference light beam 19 spreads out along a reference section with a length of, e.g., one meter and falls on an immobile reference section reflector 24 which, unlike the measuring section reflector 14, is arranged at a fixed point, but where an adjustment of the length of the reference section may be provided for so as to adapt to the length of the measuring section.

The lateral distance between the measuring section of the measuring interferometer 7 and the reference section of the reference interferometer 9 is as small as possible and amounts, e.g., to merely several centimeters in order to accomplish that changes in the temperature, air pressure, relative humidity and composition of the air in the measuring interferometer 7 will possibly be covered also by the reference interferometer 9. Therefore, the second light beam 12 and the second reference light beam 19 are not only maximally close, but the reference section and the measuring section extend also across comparable lengths in order to assure that possibly all localized disturbances in the measuring section will be covered by the reference section.

Reflected back by the reference section reflector 24 parallel to the direction of incidence, at a lateral offset, the second reference light beam 19 is with the aid of a reference section beam divider 17 so deflected to the reference signal detector 22 that an interference light beam 26 will be formed. Depending on the cycle phase, the signal incident on the reference signal detector 22 is at a minimum, a maximum or on a flank.

The control circuit illustrated in FIG. 2 serves to keep the interference signal constant on the reference signal detector 22, despite changes of the refraction index in the reference section. This is accomplished through an electronic control of the current and temperature of the semiconductor laser 1, with the vacuum wavelength or frequency of the semiconductor laser 1 being varied in such a way that the ratio of the vacuum wavelength in the reference section medium to the refraction index in the reference section medium, i.e., the actual wavelength in the medium of the reference section, will be kept constant.

As can be seen from FIG. 2, the reference signal detector 22 energizes by way of an amplifier 30 and an analog/digital converter 31 one of the inputs of a microprocessor 32 in which a control and stabilization program is stored for changing the vacuum wavelength of the semiconductor laser 1 or its frequency in such a way that the actual wavelength in the medium of the reference section and thus the measuring section, serving as measuring normal, remains constant irrespective of refraction index influences.

Fed to the microprocessor 32 is additionally the signal of a photodiode 33 which is irradiated as well by the semiconductor laser 1, is used as a monitoring diode and whose output signal is through an amplifier 34 and a threshold circuit 35 fed to the microprocessor 32, in order to assure that the supply current and the temperature of the semiconductor laser 1 will remain within the ranges provided for.

The effect of the protective function provided by the photodiode 33, e.g., is that a limitation for the current and temperature control will occur through a microprocessor 32 when the maximum output of the semiconductor laser 1 is reached.

A current set value generator 36 and a temperature set value generator 37 are as well connected with the inputs of the microprocessor 32, which through a current control output 39 and a temperature control output 38 controls the supply current and temperature of the semiconductor laser 1.

The current control output 39 connects via a digital/analog converter 40 with the input of a current control 41, with the output line 42 the semiconductor laser 1 is connected. The current control 41 contains an operating amplifier 43 which with resistors 44 through 49 is so wired that the signals furnished by the digital/analog converter 40 and the current set value generator 36 will be added.

The temperature control output 38 of the microprocessor 32 is connected with a digital/analog converter 50 whose output energizes a temperature control 51. Besides the temperature set value generator 37, the temperature control 51 comprises an operating amplifier 53 and resistors 54, 55, 56 which with one leg are wired to the noninverting input of the operating amplifier 53. The inverting input of the operating amplifier 53 is connected with a temperature sensor 57 that is thermally coupled with the semiconductor laser 1.

The output of the operating amplifier 53 is connected with a Peltier cooler 58 which as well is thermally coupled with the semiconductor laser 1. While with the aid of the Peltier cooler 58 a relatively sluggish coarse adjustment can be obtained for the vacuum wavelength or frequency of the semiconductor laser 1, the current supply through the output line 42 permits a quick and inertialess fine adjustment for compensation of refraction index influences which in time are quickly changeable, in the measuring section and the reference section, as illustrated by arrow 59 in FIG. 2.

We claim:

1. A laser interferometer for interferometric length measurement including a semiconductor laser for emitting a light beam which energizes, by way of a beam divider, a measuring interferometer for generating a measuring interference light beam, said measuring interferometer having two reflectors and a measuring section, one of said reflectors being operatively associated with a moveable object to be measured, said laser energizing a reference interferometer for generating a reference interference light beam, said reference interferometer serving to control the wavelength of said laser light beam, said reference interferometer comprising a reference section including a fixed reference reflector, said reference interference light beam adapted to energize a reference signal detector, said reference signal detector generating a reference output signal, said reference output signal being fed to a closed loop feedback control circuit, said control circuit adapted to monitor the maximum, minimum, and slope values of said reference signal detector output signal for automatically and continuously adjusting both the supply current and operating temperature of said semiconductor laser during measurement operations while said reference reflector is fixed to thereby adjust the frequency of said laser in order to maintain said reference output signal constant, the interference light beam of the measuring interferometer containing information indicative of a length to be measured and adapted to impinge on an interference signal detector, said interference signal detector generating a measurement output signal which is fed to an evaluating device for determining the length to be measured, said reference section extending parallel to said measurement section a longitudinal distance substantially equal to the length of said measuring section, the lateral distance between said reference and measuring sections being very small relative to the length of said measuring section, said fixed reference reflector being adjustable in the longitudinal direction of said reference section whereby said reference section may be adapted to the length of said measuring section between measuring operations.

2. Laser interferometer according to claim 1, characterized in that the control circuit is connected to a Peltier cooler which is thermally coupled with the semiconductor laser.

3. Laser interferometer according to claim 2, characterized in that the control circuit includes a temperature sensor which is thermally coupled with the semiconductor laser.

4. Laser interferometer according to claim 1 and further including a light-sensitive monitoring diode which is optically coupled to the light of the semiconductor laser to enable the control circuit to control the supply current and operating temperature of the semiconductor laser.

5. Laser interferometer according to claim 1, characterized in that the reference section of the reference interferometer extends parallel to the measuring section of the measuring interferometer, at a lateral distance therefrom of several centimeters.

6. A Laser interferometer according to claim 3, characterized in that the control circuit includes a microprocessor to which the output signal of the reference signal detector is linked with the set values of the supply current and the operating temperature of the semiconductor laser is connected.

* * * * *